United States Patent
Tao et al.

(10) Patent No.: US 10,879,890 B1
(45) Date of Patent: Dec. 29, 2020

(54) CASCADE COMPLEMENTARY SOURCE FOLLOWER AND CONTROLLING CIRCUIT

(71) Applicant: LONTIUM SEMICONDUCTOR CORPORATION, Anhui (CN)

(72) Inventors: Cheng Tao, Anhui (CN); Xiangyu Ji, Anhui (CN); Yu Chen, Anhui (CN); Haiyan Wei, Anhui (CN); Yanan Zhang, Anhui (CN); Jiaxi Fu, Anhui (CN)

(73) Assignee: LONTIUM SEMICONDUCTOR CORPORATION, Anhui (CN)

(*) Notice: Subject to any disclaimer, the term of this patent is extended or adjusted under 35 U.S.C. 154(b) by 0 days.

(21) Appl. No.: 16/748,015

(22) Filed: Jan. 21, 2020

(30) Foreign Application Priority Data

Dec. 5, 2019 (CN) .......................... 2019 1 1234805

(51) Int. Cl.
*H03F 1/30* (2006.01)
*H03K 17/14* (2006.01)

(52) U.S. Cl.
CPC ..... *H03K 17/145* (2013.01); *H03F 2200/219* (2013.01)

(58) Field of Classification Search
CPC .......................... H03K 17/145; H03F 2200/219
See application file for complete search history.

(56) References Cited

U.S. PATENT DOCUMENTS

2019/0281242 A1* 9/2019 Cheng .................... H04N 5/378

* cited by examiner

*Primary Examiner* — Dinh T Le
(74) *Attorney, Agent, or Firm* — Cantor Colburn LLP

(57) ABSTRACT

A cascade complementary source follower and a controlling circuit are provided. The source follower circuit includes: a source follower circuit including at least two MOS transistors, and a feedback circuit configured to clamp a voltage on a MOS transistor that provides an output voltage in the source follower circuit and to change a gate-source voltage of the MOS transistor by adjusting a bias current supplied to the MOS transistor, so that an output voltage can precisely follow an input voltage.

14 Claims, 11 Drawing Sheets

US 10,879,890 B1

CASCADE COMPLEMENTARY SOURCE FOLLOWER AND CONTROLLING CIRCUIT

CROSS-REFERENCE TO RELATED APPLICATIONS

The present application claims priority under 35 U.S.C. § 119 to Chinese patent application No. 201911234805.1, filed on Dec. 5, 2019, the entire contents of which being incorporated herein by reference.

FIELD

The present disclosure relates to the field of integrated circuit technologies, and particularly to a cascade complementary source follower and a controlling circuit.

BACKGROUND

Source followers based on metal oxide semiconductor field effect transistors (i.e., MOSFET, which is also referred to as MOS transistor) are widely used in circuits with various functions. For example, a source follower normally can be used as a high speed input buffer, which has a simple circuit structure and can provide a high input impedance, a low output impedance and a wide signal bandwidth. A source follower mainly includes an N-type source follower including an N-type MOS transistor and a P-type source follower including a P-type MOS transistor, and is normally used as a simple voltage buffer, a drive capacitor or a resistive load.

A circuit configuration of an N-type source follower is shown in FIG. 1. The N-type source follower includes an N-type MOS transistor M1. The gate of the N-type MOS transistor M1 functions as the input terminal of the source follower and is connected to an input voltage $V_i$. The source of the N-type MOS transistor M1 functions as the output terminal of the source follower to provide an output voltage $V_o$ and is grounded through a current source I1. The drain of the N-type MOS transistor M1 is connected to a power supply voltage VDD1. In this configuration, I1 provides a bias current for M1. For an alternating current (AC) component of a signal, since $V_o$ varies with $V_i$, that is $V_{oAc}=V_{iAc}$, the follower shown in FIG. 1 is called a source follower. However, for a direct current (DC) component of the signal, i.e., for a common mode voltage, due to the existence of a gate-source voltage $V_{GS1}$, an output common mode voltage is less than an input common mode voltage by $V_{GS1}$, that is, $V_{oDC}=V_{iDC}-V_{GS1}$.

A circuit configuration of a P-type source follower is shown in FIG. 2. The P-type source follower includes a P-type MOS transistor M2. The gate of the P-type MOS transistor M2 functions as the input terminal of the source follower, and is connected to an input voltage $V_i$. The source of the P-type MOS transistor M2 functions as the output terminal of the source follower to provide an output voltage $V_o$ and is connected to a power supply voltage VDD2 through a current source I2. The drain of the P-type MOS transistor M2 is grounded. In this configuration, I2 provides a bias current for M2. For an AC component of a signal, $V_o$ varies with that is $V_{oAc}=V_{iAc}$. However, for a DC component of the signal, i.e., for a common mode voltage, due to the existence of a gate-source voltage $V_{GS2}$, an output common mode voltage is higher than an input common mode voltage by $V_{GS2}$.

It can be seen that in conventional technologies, no matter in an N-type source follower or in a P-type source follower, for a DC component of a signal, there is a difference between the output common voltage and the input common voltage, the difference being identical to the gate-source voltage of the MOS transistor. In a conventional source follower, an output signal can only follow the AC component of an input signal, but can not follow the DC component of the input signal.

SUMMARY

In view of this, a cascade complementary source follower is provided according to the present disclosure, which is beneficial to reducing an error voltage, so as to make an output precisely follow an input.

The following technical solutions are provided according to the present disclosure to achieve the above objective.

A cascade complementary source follower is provided, including:

a source follower circuit including at least two MOS transistors; and a feedback circuit, configured to clamp a voltage on a MOS transistor that provides an output voltage in the source follower circuit and to change a gate-source voltage of the MOS transistor by adjusting a bias current supplied to the MOS transistor.

In an embodiment, in the cascade complementary source follower, the source follower circuit has an input terminal configured to receive an input voltage and an output terminal configured to provide an output voltage; and the feedback circuit includes an operational amplifier and a controlling MOS transistor, where the operational amplifier has a non-inverting input terminal that is connected to the output terminal of the source follower circuit, an inverting input terminal that is connected to the input terminal of the source follower circuit, and an output terminal that is connected to a gate of the controlling MOS transistor, and the controlling MOS transistor has a drain that is connected to the output terminal of the source follower circuit and a source that is connected to a set potential.

In an embodiment, in the cascade complementary source follower, the controlling MOS transistor is an N-type MOS transistor and the set potential is a grounded zero potential.

In an embodiment, in the cascade complementary source follower, the source follower circuit includes an N-type source sub-follower and a P-type source sub-follower that are cascaded;

the N-type source sub-follower includes an N-type MOS transistor, where the N-type MOS transistor has a source functioning as the output terminal of the source follower circuit and grounded through a first current source, and a drain that is connected to a first power supply voltage; and the P-type source sub-follower includes a P-type MOS transistor, where the P-type MOS transistor has a gate that functions as the input terminal of the source follower circuit, a source that is connected to a second power supply voltage through a second current source and to a gate of the N-type MOS transistor, and a drain that is grounded.

In an embodiment, in the cascade complementary source follower, the source follower circuit includes an N-type source sub-follower and a P-type source sub-follower that are cascaded;

the N-type source sub-follower includes a first N-type MOS transistor and a second N-type MOS transistor, where the first N-type MOS transistor has a source that is connected to the output terminal of the source follower circuit, and a drain that is connected to a first power supply voltage through a first current source and to a gate of the second N-type MOS transistor, and the second N-type MOS transistor has a drain that is connected to the output terminal of the source follower circuit and a source that is grounded;

the P-type source sub-follower includes a first P-type MOS transistor and a second P-type MOS transistor, where the first P-type MOS transistor has a gate that functions as the input terminal of the source follower circuit, a drain that is grounded through a second current source, and a source that is connected to a gate of the first N-type MOS transistor, and the second P-type MOS transistor has a gate that is connected to the drain of the first P-type MOS transistor, a source that is connected to a second power supply voltage, and a drain that is connected to the source of the first P-type MOS transistor.

In an embodiment, in the cascade complementary source follower, the controlling MOS transistor is a P-type MOS transistor and the set potential is a second power supply voltage.

In an embodiment, in the cascade complementary source follower, the source follower circuit includes an N-type source sub-follower and a P-type source sub-follower that are cascaded;

the N-type source sub-follower includes an N-type MOS transistor, where the N-type MOS transistor has a gate that functions as the input terminal of the source follower circuit, a drain that is connected to a first power supply voltage, and a source that is grounded through a first current source; and the P-type source sub-follower includes a P-type MOS transistor, where the P-type MOS transistor has a gate that is connected to the source of the N-type MOS transistor, a source that functions as the output terminal of the source follower circuit and is connected to a second power supply voltage through a second current source, and a drain that is grounded.

In an embodiment, in the cascade complementary source follower, the source follower circuit includes an N-type source sub-follower and a P-type source sub-follower that are cascaded;

the N-type sub-source follower includes a first N-type MOS transistor and a second N-type MOS transistor, where the first N-type MOS transistor has a gate that functions as the input terminal of the source follower circuit, a source that is connected to a drain of the second N-type MOS transistor, and a drain that is connected to a first power supply voltage through a first current source, and the second N-type MOS transistor has a gate that is connected to the drain of the first N-type MOS transistor, and a source that is grounded; and the P-type source sub-follower includes a first P-type MOS transistor and a second P-type MOS transistor, where the first P-type MOS transistor has a gate that is connected to the source of the first N-type MOS transistor, a source that is connected to the output terminal of the source follower circuit, and a drain that is grounded through a second current source, and the second P-type MOS transistor has a gate that is connected to the drain of the first P-type MOS transistor, a source that is connected to a second power supply voltage, and a drain that is connected to the source of the first P-type MOS transistor.

A controlling circuit is further provided according to the present disclosure, which includes the cascade complementary source follower as described above.

According to above descriptions, the cascade complementary source follower according to the embodiments of the present disclosure includes a source follower circuit and a feedback circuit. The feedback circuit is configured to clamp a voltage on a MOS transistor that provides an output voltage in the source follower circuit and to change a gate-source voltage of the MOS transistor by adjusting a bias current supplied to the MOS transistor, thereby making an output precisely follow an input.

BRIEF DESCRIPTION OF THE DRAWINGS

In order to more clearly describe the technical solutions in the embodiments of the present disclosure or the technical solutions in the conventional technologies, drawings to be used in the description of the embodiments of the present disclosure or the conventional technologies are briefly described hereinafter. It is apparent that the drawings described below merely show some embodiments of the present disclosure, and those skilled in the art may obtain other drawings according to the provided drawings without any creative effort.

DETAILED DESCRIPTION OF EMBODIMENTS

Technical solutions of embodiments of the present disclosure are clearly and completely described below in conjunction with the drawings of the embodiments of the present disclosure. Apparently, the embodiments described in the following are only some embodiments of the present disclosure, rather than all the embodiments. Any other embodiments obtained by those skilled in the art based on the embodiments in the present disclosure without any creative effort fall within the protection scope of the present disclosure.

As described in background section, in conventional technologies, no matter in an N-type source follower or in a P-type source follower, for a DC component of a signal, there is a difference between the output common voltage and the input common voltage, the difference being identical to the gate-source voltage of the MOS transistor. In a conventional source follower, an output signal can only follow the AC component of an input signal, but can not follow the DC component of the input signal.

A cascade complementary source follower is provided according to the present disclosure to solve the above problems. The cascade complementary source follower includes:

a source follower circuit including at least two MOS transistors; and a feedback circuit, configured to clamp a voltage on a MOS transistor that provides an output voltage in the source follower circuit and to change a gate-source voltage of the MOS transistor by adjusting a bias current supplied to the MOS transistor.

In can be seen that in the cascade complementary source follower according to the embodiment of the present disclosure, a source follower circuit is formed by cascading an N-type source follower and a P-type source follower, and a feedback circuit is added to the source follower circuit, where the feedback circuit is configured to clamp a voltage on a MOS transistor that provides an output voltage in the source follower circuit and to change a gate-source voltage of the MOS transistor by adjusting a bias current supplied to the MOS transistor, thereby making an output precisely follow an input.

In order for a clearer understanding of the above objects, features and advantages of the present disclosure, the present disclosure is further described in conjunction with the drawings and embodiments.

Figure 1:
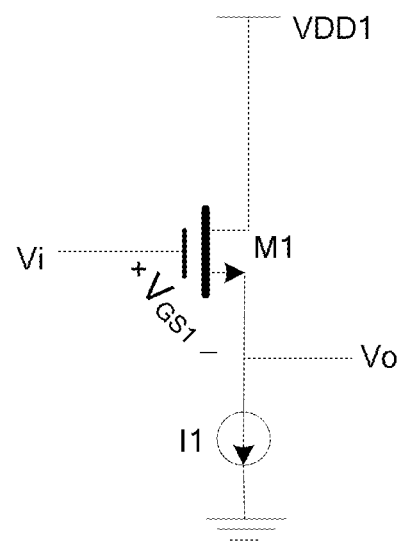
FIG. 1 is a circuit configuration diagram of an N-type source follower.
Figure 2:
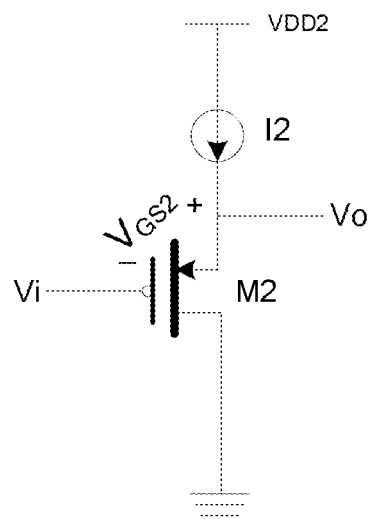
FIG. 2 is a circuit configuration diagram of a P-type source follower.
Figure 3:
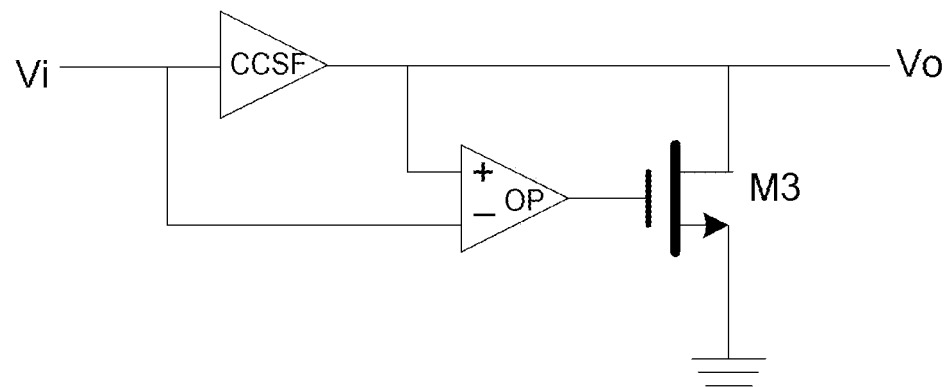
FIG. 3 is a circuit configuration diagram of a cascade complementary source follower with an N-type controlling MOS transistor according to an embodiment of the present disclosure.
Figure 4:
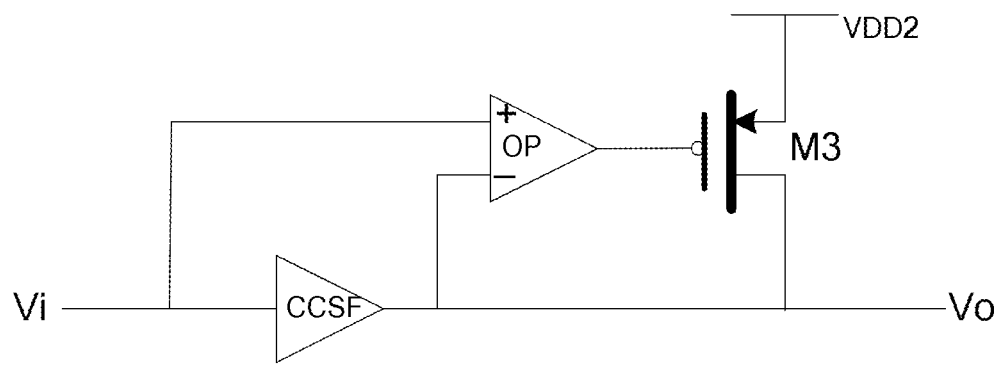
FIG. 4 is a circuit configuration diagram of a cascade complementary source follower with a P-type controlling MOS transistor according to an embodiment of the present disclosure.

Referring to FIG. 3 and FIG. 4, FIG. 3 is a circuit configuration diagram of a cascade complementary source follower with an N-type controlling MOS according to an embodiment of the present disclosure and FIG. 4 a circuit configuration diagram of a cascade complementary source follower with a P-type controlling MOS according to an embodiment of the present disclosure.

As shown in FIG. 3 or FIG. 4, the cascade complementary source follower includes:

a source follower circuit CCSF including at least two MOS transistors; and a feedback circuit, configured to clamp a voltage on a MOS transistor that provides an output voltage Vo in the source follower circuit and to change a gate-source voltage of the MOS transistor by adjusting a bias current supplied to the MOS transistor.

In an embodiment, an input terminal of the source follower circuit CCSF is configured to receive an input voltage Vi and an output terminal of the source follower circuit CCSF is configured to provide the output voltage Vo; and the feedback circuit includes an operational amplifier OP and a controlling MOS transistor M3. As shown in FIG. 3, a non-inverting input terminal of the operational amplifier OP is connected to the output terminal of the source follower circuit CCSF, an inverting input terminal of the operational amplifier OP is connected to the input terminal of the source follower circuit CCSF, and an output terminal of the operational amplifier OP is connected to a gate of the controlling MOS transistor M3. A drain of the controlling MOS transistor M3 is connected to the output terminal of the source follower circuit CCSF, and a source of the controlling MOS transistor M3 is connected to a set potential. The controlling MOS transistor M3 is an N-type MOS transistor and the set potential is a grounded zero potential.

As shown in FIG. 4, a non-inverting input terminal of the operational amplifier OP is connected to the input terminal of the source follower circuit CCSF, an inverting input terminal of the operational amplifier OP is connected to the output terminal of the source follower circuit CCSF, and an output terminal of the operational amplifier OP is connected to a gate of the controlling MOS transistor M3. A drain of the controlling MOS transistor M3 is connected to the output terminal of the source follower circuit CCSF, and a source of the controlling MOS transistor M3 is connected to a set potential. The controlling MOS transistor M3 is a P-type MOS transistor and the set potential is a second power supply voltage VDD2.

According to embodiments of the present disclosure, the source follower circuit CCSF including two MOS can be implemented in two ways.

Figure 5:
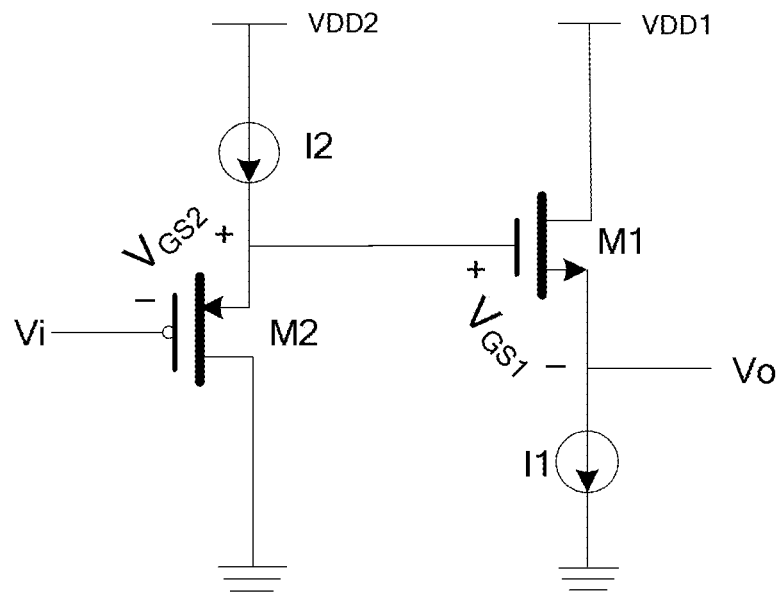
FIG. 5 is a circuit configuration diagram of a source follower circuit according to an embodiment of the present disclosure.

In one way, as shown in FIG. 5, the source follower circuit includes an N-type source sub-follower and a P-type source sub-follower that are cascaded. The N-type source sub-follower includes an N-type MOS transistor M1, where a source of the N-type MOS transistor M1 functions as the output terminal of the source follower circuit and is grounded through a first current source I1, and a drain of the N-type MOS transistor M1 is connected to a first power supply voltage VDD1. The P-type source sub-follower includes a P-type MOS transistor M2, where a gate of the P-type MOS transistor M2 functions as the input terminal of the source follower circuit, a source of the P-type MOS transistor M2 is connected to a second power supply voltage VDD2 through a second current source I2 and to a gate of the N-type MOS transistor M1, and a drain of the P-type MOS transistor M2 is grounded. $V_{GS1}$ is a gate-source voltage of the N-type MOS transistor M1 and $V_{GS2}$ is a gate-source voltage of the P-type MOS transistor M2.

Figure 6:
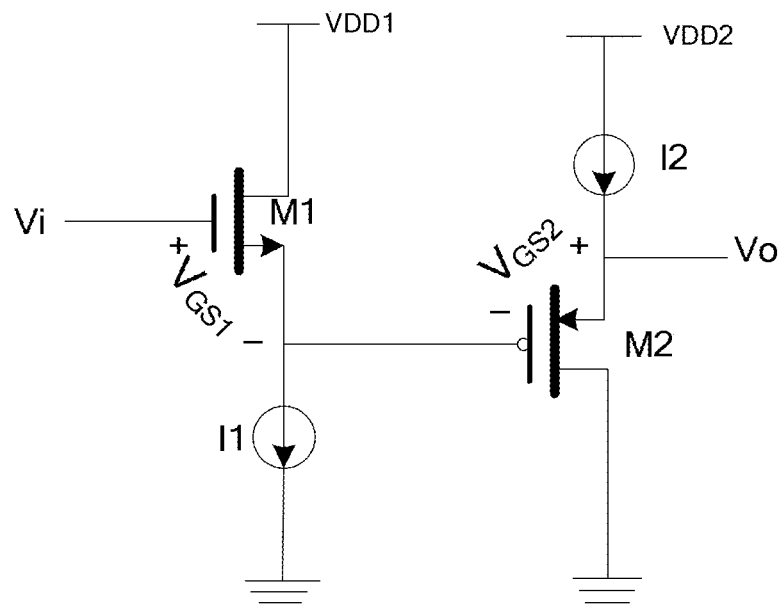
FIG. 6 is a circuit configuration diagram of a source follower circuit according to another embodiment of the present disclosure.

In another way, as shown in FIG. 6, the source follower circuit includes an N-type source sub-follower and a P-type source sub-follower that are cascaded. The N-type source sub-follower includes an N-type MOS transistor M1, where a gate of the N-type MOS transistor M1 functions as the input terminal of the source follower circuit, a drain of the N-type MOS transistor M1 is connected to a first power supply voltage VDD1, and a source of the N-type MOS transistor M1 is grounded through a first current source I1. The P-type source sub-follower includes a P-type MOS transistor M2, where a gate of the P-type MOS transistor M2 is connected to the source of the N-type MOS transistor M1, a source of the P-type MOS transistor M2 functions as the output terminal of the source follower circuit and is connected to a second power supply voltage VDD2 through a second current source I2, and a drain of the P-type MOS transistor M2 is grounded. $V_{GS1}$ is a gate-source voltage of the N-type MOS transistor M1 and $V_{GS2}$ is a gate-source voltage of the P-type MOS transistor M2.

In the above two ways, it is hard to guarantee that $V_{GS1}$ is approximately identical to $V_{GS2}$ in all conditions due to factors such as deviations in processes, temperature changes, device parameters mismatching and the like. In order to solve the problem, a feedback circuit is introduced according to the present disclosure to guarantee that following performance of input and output does not change too much with the above factors.

Figure 7:
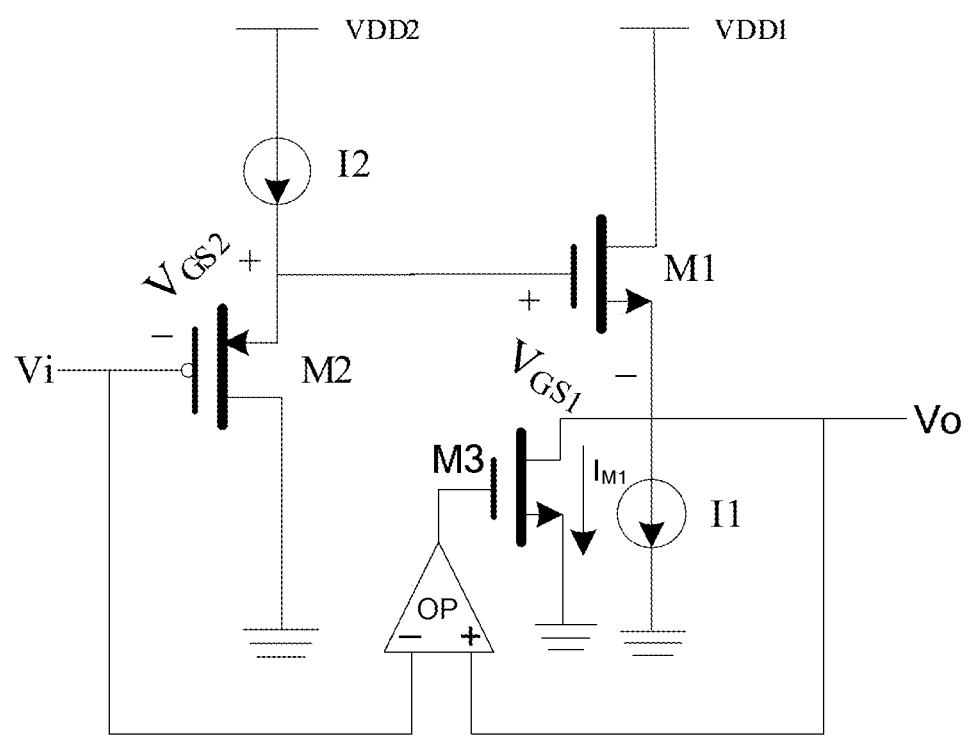
FIG. 7 is a circuit configuration diagram of a cascade complementary source follower obtained by introducing a feedback circuit to the circuit shown in FIG. 5.

Referring to FIG. 7, FIG. 7 is a circuit configuration diagram of a cascade complementary source follower obtained by introducing a feedback circuit to the circuit shown in FIG. 5. In order to guarantee that an output can desirably follow an input in any process, temperature and voltage conditions, a feedback circuit including an operational amplifier OP and an N-type controlling MOS transistor M3 is introduced between the input and the output. An inverting input terminal of the operational amplifier OP is connected to an input terminal of the P-type MOS transistor M2, a non-inverting input terminal of the operational amplifier OP is connected to an output terminal of the N-type MOS transistor M1, an output terminal of the operational amplifier OP is connected to a gate of the controlling MOS transistor M3, and a drain of the controlling MOS transistor M3 is connected to the output terminal of the N-type MOS transistor M1.

In this case, a bias current of the N-type MOS transistor M1 is composed of a fixed bias current and an output current $I_{M1}$ of the controlling MOS transistor M3, where $I_{M1}$ can be changed under the control of the feedback circuit. When the output voltage Vo is higher (lower) than the input voltage Vi, an output voltage of the operational amplifier OP, i.e., a gate voltage of the controlling MOS transistor M3, increases (decreases), and the output current $I_{M1}$ of the controlling MOS transistor M3 increases (decreases), which is equivalent to increasing (reducing) the bias current of M1, resulting in increase (decrease) of the gate-source voltage $V_{GS1}$ of M1. Since a gate voltage of M1 is approximately constant, a source voltage of M1, i.e., the output voltage Vo of the source follower circuit CCSF, is reduced (increased). When Vo is approximately identical to Vi, the feedback circuit is in a stable state. In this way, the feedback circuit is configured to clamp a voltage on the N-type MOS transistor M1 and to change the gate-source voltage $V_{GS1}$ of the N-type MOS transistor M1 by adjusting the bias current supplied to the N-type MOS transistor M1, thereby making the output precisely follow the input.

Figure 8:
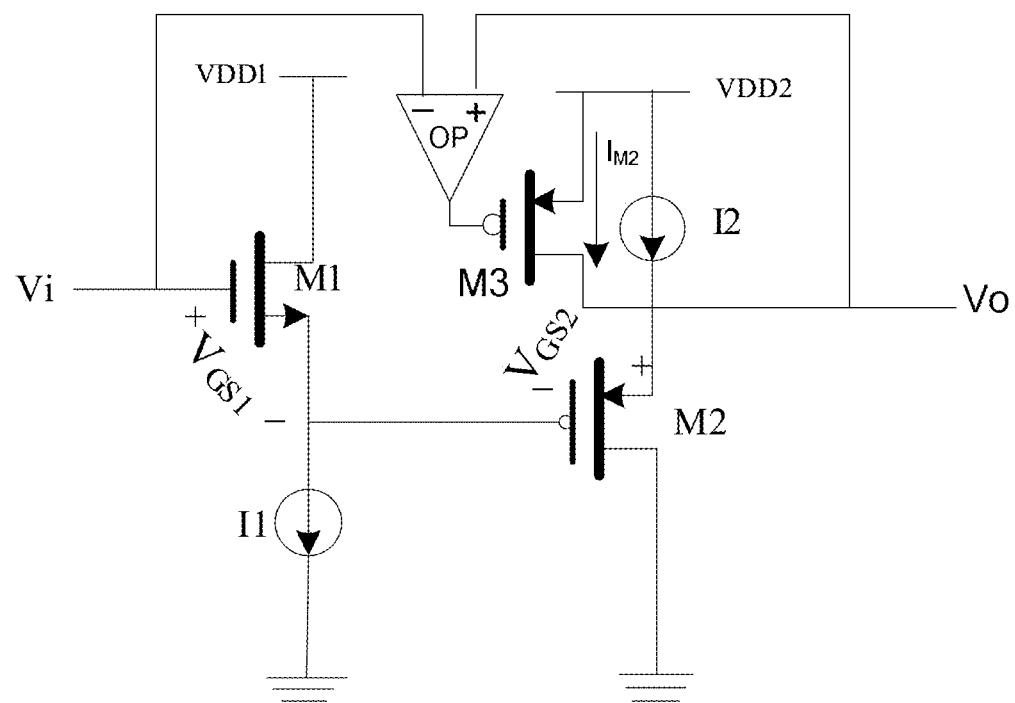
FIG. 8 is a circuit configuration diagram of a cascade complementary source follower obtained by introducing a feedback circuit to the circuit shown in FIG. 6.

Similarly, FIG. 8 is a circuit configuration diagram of a cascade complementary source follower by introducing a feedback circuit to the circuit shown in FIG. 6. As shown in FIG. 8, a feedback circuit including an operational amplifier OP and a P-type controlling MOS transistor M3 is introduced between the input and the output. An inverting input terminal of the operational amplifier OP is connected to an input terminal of the N-type MOS transistor M1, a non-inverting input terminal of the operational amplifier OP is connected to an output terminal of the P-type MOS transistor M2, an output terminal of the operational amplifier OP is connected to a gate of the controlling MOS transistor M3, and a drain of the controlling MOS transistor M3 is connected to the output terminal of the P-type MOS transistor M2.

In this case, a bias current of the P-type MOS transistor M2 is composed of a fixed bias current and an output current $I_{M2}$ of the controlling MOS transistor M3, where $I_{M2}$ can be changed under the control of the feedback circuit. When the output voltage Vo is higher (lower) than the input voltage Vi, an output voltage of the operational amplifier OP, i.e., a gate voltage of the controlling MOS transistor M3, increases (decreases), and the output current $I_{M2}$ of the controlling MOS transistor M3 increases (decreases), which is equivalent to increasing (reducing) the bias current of M2, resulting in increase (decrease) of the gate-source voltage $V_{GS2}$ of M2. Since a gate voltage of M2 is approximately constant, a source voltage of M2, i.e., the output voltage Vo of the source follower circuit CCSF, is reduced (increased). When Vo is approximately identical to Vi, the feedback circuit is in a stable state. In this way, the feedback circuit is configured to clamp a voltage on the P-type MOS transistor M2 and to change the gate-source voltage $V_{GS2}$ of the P-type MOS transistor M2 by adjusting the bias current supplied to the P-type MOS transistor M2, thereby making the output precisely follow the input.

Figure 9:
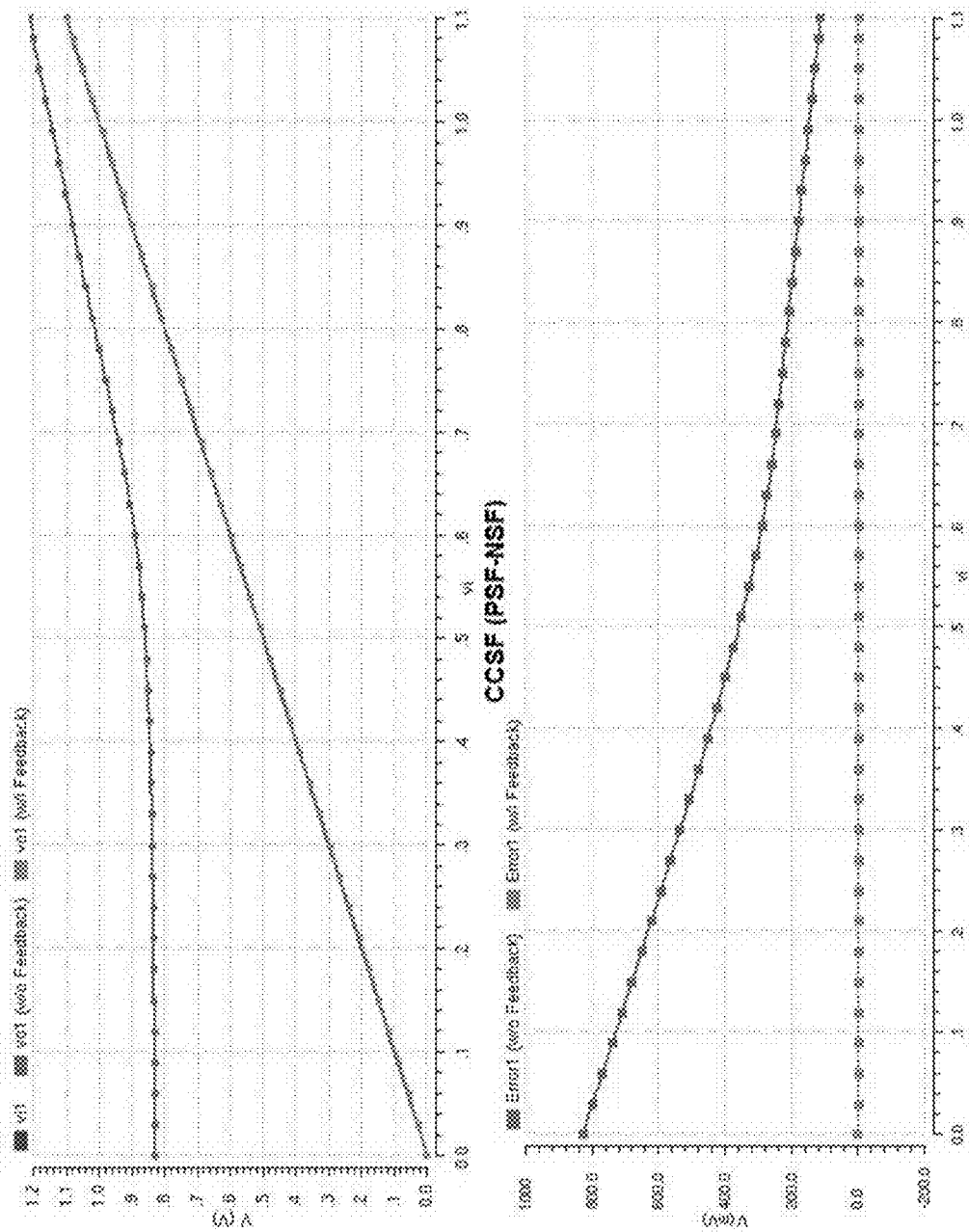
FIG. 9 is a voltage pattern diagram of a cascade complementary source follower with a feedback circuit introduced according to an embodiment of the present disclosure.
Figure 10:
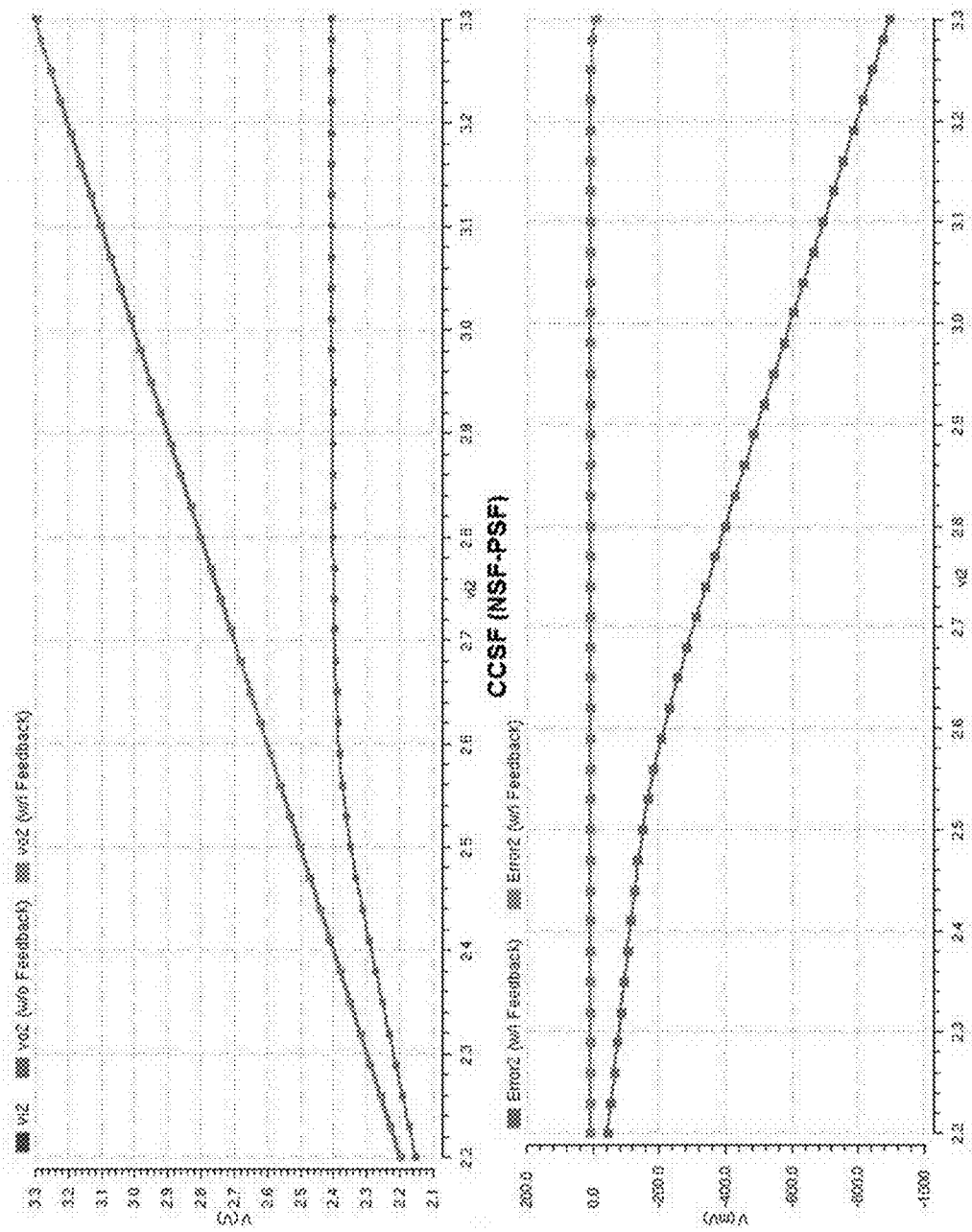
FIG. 10 is a voltage pattern diagram of a cascade complementary source follower with a feedback circuit introduced according to another embodiment of the present disclosure.

Referring to FIG. 9 and FIG. 10, FIG. 9 is a voltage pattern diagram of a cascade complementary source follower with a feedback circuit introduced according to an embodiment of the present disclosure. FIG. 10 is a voltage pattern diagram of another cascade complementary source follower with a feedback circuit introduced according to an embodiment of the present disclosure.

As shown in FIG. 9, in the upper graph, the horizontal axis represents the input voltage Vi and the vertical axis represents the output voltage Vo, and in the lower graph, the horizontal axis represents the input voltage Vi and the vertical axis represents a difference between the input voltage Vi and the output voltage Vo. The upper line in the upper graph represents the output voltage Vo obtained without a feedback circuit introduced, and the lower line in the upper graph is actually two lines coinciding with each other, one of which represents the input voltage Vi and the other of which represents the output voltage Vo obtained with a feedback circuit introduced. As FIG. 9 shows, the output voltage Vo changes with the input voltage Vi, and the output voltage Vo obtained with a feedback circuit introduced desirably follows the input voltage Vi, where the difference between the input voltage and the output voltage is kept stable and approximately zero. However, there is a major difference between the input voltage Vi and the output voltage Vo obtained without a feedback circuit introduced; hence, the output cannot follow the input. As can be seen, the technical effect that the output precisely follows the input can be achieved by the cascade complementary source follower with a feedback circuit.

Similarly, as shown in FIG. 10, in the upper graph, the horizontal axis represents the input voltage Vi and the vertical axis represents the output voltage Vo, and in the lower graph, the horizontal axis represents the input voltage Vi and the vertical axis represents a difference between the input voltage Vi and the output voltage Vo. The upper line the upper graph is actually two lines coinciding with each other, one of which represents the input voltage Vi and the other of which represents the output voltage Vo obtained with a feedback circuit introduced, and the lower line in the upper graph represents the output voltage Vo obtained without a feedback circuit introduced. As FIG. 10 shows, the output voltage Vo changes with the input voltage Vi, and the output voltage Vo obtained with a feedback circuit introduced desirably follows the input voltage Vi, where the difference between the input voltage and the output voltage is kept stable and approximately zero. However, there is a major difference between the input voltage Vi and the output voltage Vo obtained without a feedback circuit introduced; hence, the output cannot follow the input. As can be seen, the technical effect that the output precisely follows the input can be achieved by the cascade complementary source follower with a feedback circuit.

The feedback circuit according to the embodiments of the present disclosure applies not only to the cascade complementary source follower (CCSF) but also to other source follower with similar functions, such as a super source follower (SSF) and a flipped voltage follower (FVF). Since the super source follower and the flipped voltage follower are also source followers substantively, the technical effect that the output precisely follows the input can also be realized by cascading the super source follower or the flipped voltage follower and further introducing a feedback circuit.

Figure 11:
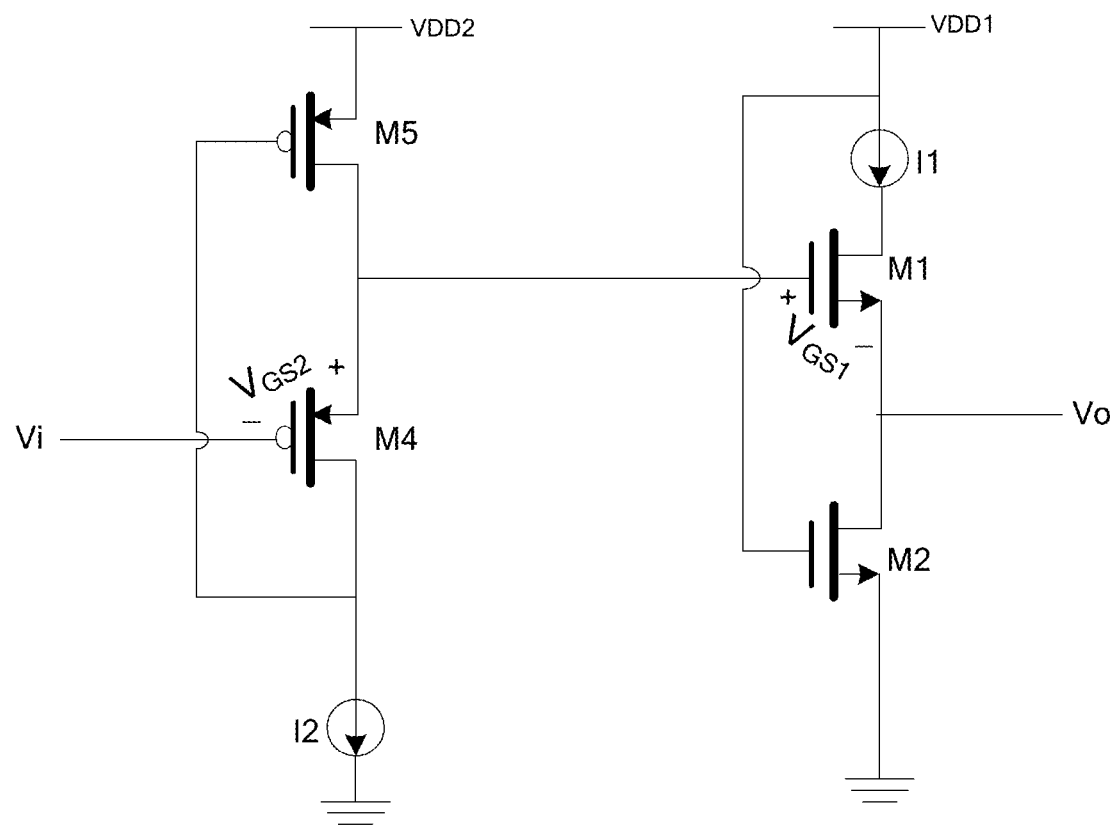
FIG. 11 is a circuit configuration diagram of a source follower circuit in a cascade complementary flipped voltage follower according to an embodiment of the present disclosure.

Referring to FIG. 11, FIG. 11 is a circuit configuration diagram in a source follower circuit of a cascade complementary flipped voltage follower according to an embodiment of the present disclosure. As shown in FIG. 11, the source follower circuit includes an N-type source sub-follower and a P-type source sub-follower that are cascaded. The N-type source sub-follower includes a first N-type MOS transistor M1 and a second N-type MOS transistor M2, where a source of the first N-type MOS transistor M1 is connected to an output terminal of the source follower circuit, and a drain of the first N-type MOS transistor M1 is connected to a first power supply voltage VDD1 through a first current source I1 and to a gate of the second N-type MOS transistor M2; and a drain of the second N-type MOS transistor M2 is connected to the output terminal of the source follower circuit and a source of the second N-type MOS transistor M2 is grounded. The P-type source sub-follower includes a first P-type MOS transistor M4 and a second P-type MOS transistor M5, where a gate of the first P-type MOS transistor M4 functions as an input terminal of the source follower circuit, a drain of the first P-type MOS transistor M4 is grounded through a second current source I2, and a source of the first P-type MOS transistor M4 is connected to a gate of the first N-type MOS transistor M1; and a gate of the second P-type MOS transistor M5 is connected to the drain of the first P-type MOS transistor M4, a source of the second P-type MOS transistor M5 is connected to a second power supply voltage VDD2, and a drain of the second P-type MOS transistor M5 is connected to the source of the first P-type MOS transistor M4. $V_{GS1}$ is a gate-source voltage of the first N-type MOS transistor M1 and $V_{GS2}$ is a gate-source voltage of the first P-type MOS transistor M4.

Figure 12:
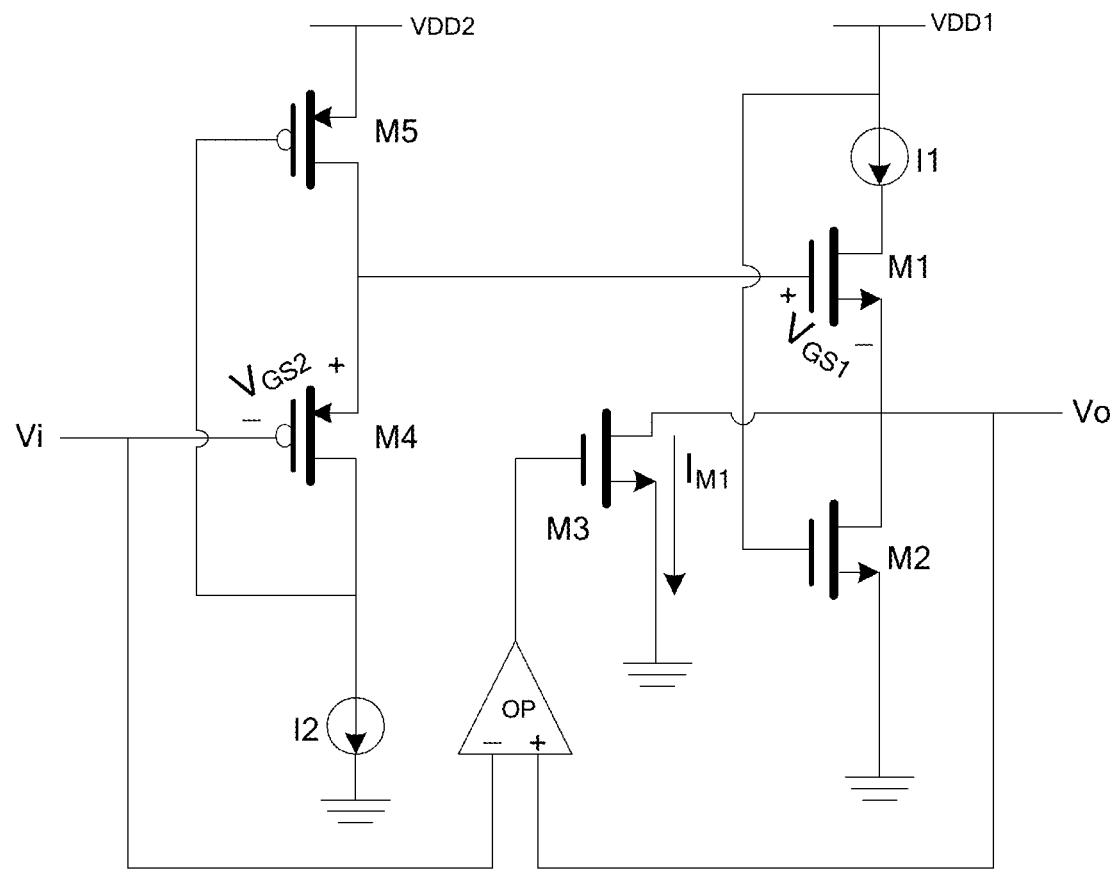
FIG. 12 is a circuit configuration diagram of a cascade complementary flipped voltage follower obtained by introducing a feedback circuit to the circuit shown in FIG. 11.

Referring to FIG. 12, FIG. 12 is a circuit configuration diagram of a cascade complementary flipped voltage follower obtained by introducing a feedback circuit to the circuit shown in FIG. 11. As shown in FIG. 12, in order to guarantee that an output can desirably follow an input in any process, temperature and voltage conditions, a feedback circuit including an operational amplifier OP and an N-type controlling MOS transistor M3 is introduced between the input and the output. An inverting input terminal of the operational amplifier OP is connected to an input terminal of the P-type MOS transistor M4, a non-inverting input terminal of the operational amplifier OP is connected to an output terminal of the N-type MOS transistor M2, an output terminal of the operational amplifier OP is connected to a gate of the controlling MOS transistor M3. A drain of the controlling MOS transistor M3 is connected to the output terminal of the N-type MOS transistor M2, and a source of the controlling MOS transistor M3 is grounded. Reference can be made to the counterpart in the cascade complementary source follower according to the foregoing embodiments for similar parts, which is not redundantly described herein.

Figure 13:
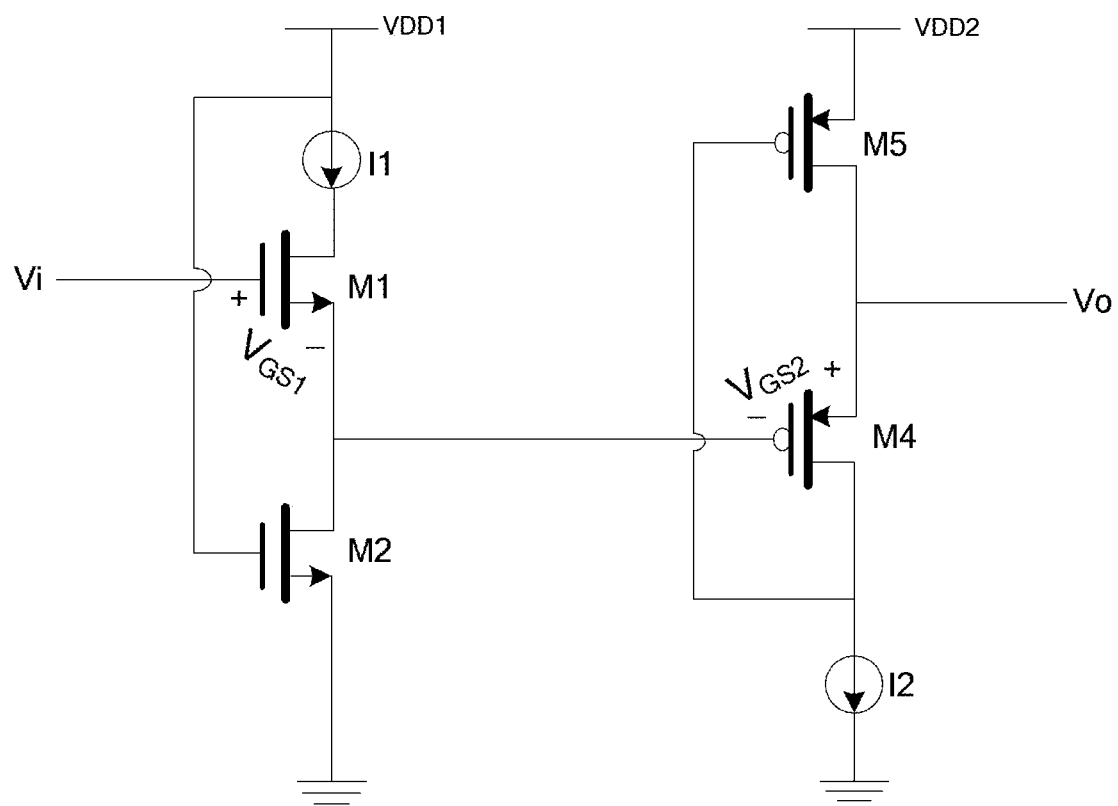
FIG. 13 is a circuit configuration diagram of a source follower circuit in a cascade complementary flipped voltage follower according to another embodiment of the present disclosure.

Referring to FIG. 13, FIG. 13 is a circuit configuration diagram of a source follower circuit in a cascade complementary flipped voltage follower according to another embodiment of the present disclosure. As shown in FIG. 13, the source follower circuit includes an N-type source sub-follower and P-type source sub-follower that are cascaded. The N-type source sub-follower includes a first N-type MOS transistor M1 and a second N-type MOS transistor M2, where a gate of the first N-type MOS transistor M1 functions as an input terminal of the source follower circuit, a source of the first N-type MOS transistor M1 is connected to a drain of the second N-type MOS transistor M2, and a drain of the first N-type MOS transistor M1 is connected to a first power supply voltage VDD1 through a first current source I1; and a gate of the second N-type MOS transistor M2 is connected to the drain of the first N-type MOS transistor M1, and a source of the second N-type MOS transistor M2 is grounded. The P-type source sub-follower includes a first P-type MOS transistor M4 and a second P-type MOS transistor M5, where a gate of the first P-type MOS transistor M4 is connected to the source of the first N-type MOS transistor M1, a source of the first P-type MOS transistor M4 is connected to an output terminal of the source follower circuit, and a drain of the first P-type MOS transistor M4 is grounded through a second current source I2; and a gate of the second P-type MOS transistor M5 is connected to the drain of the first P-type MOS transistor M4, a source of the second P-type MOS transistor M5 is connected to a second power supply voltage VDD2, and a drain of the second P-type MOS transistor M5 is connected to the source of the first P-type MOS transistor M4. $V_{GS1}$ is a gate-source voltage of the first N-type MOS transistor M1 and $V_{GS2}$ is a gate-source voltage of the first P-type MOS transistor M4.

Figure 14:
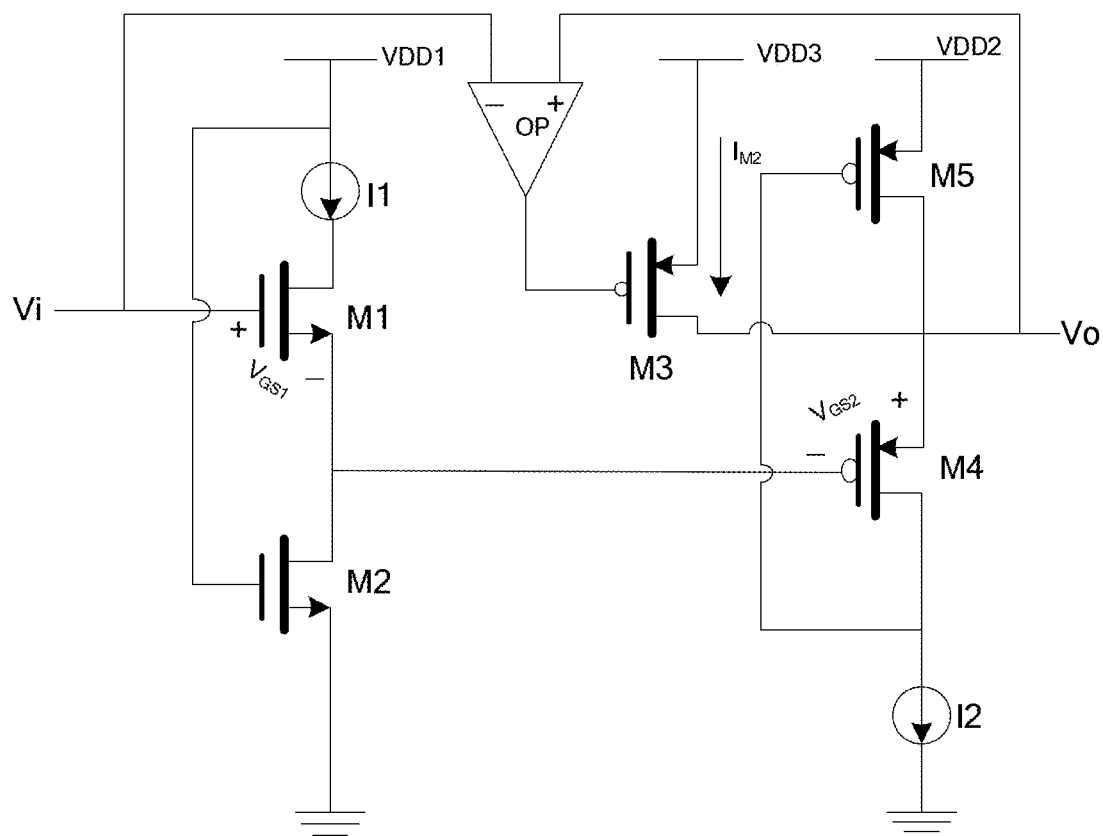
FIG. 14 is a circuit configuration diagram of a cascade complementary flipped voltage follower obtained by introducing a feedback circuit to the circuit shown in FIG. 13.

Referring to FIG. 14, FIG. 14 is a circuit configuration diagram of a cascade complementary flipped voltage follower obtained by introducing a feedback circuit to the circuit shown in FIG. 13. As shown in FIG. 14, in order to guarantee that an output can precisely follow an input in any process, temperature and voltage conditions, a feedback circuit including an operational amplifier OP and a P-type controlling MOS transistor M3 is introduced between the input and the output. An inverting input terminal of the operational amplifier OP is connected to an input terminal of the N-type MOS transistor M1, a non-inverting input terminal of the operational amplifier OP is connected to an output terminal of the P-type MOS transistor M5, and an output terminal of the operational amplifier OP is connected to a gate of the controlling MOS transistor M3. A drain of the controlling MOS transistor M3 is connected to the output terminal of the P-type MOS transistor M5, and a source of the controlling MOS transistor M3 is connected to a third power supply voltage VDD3. Reference can be made to the counterpart in the cascade complementary source follower according to the foregoing embodiments for similar parts, which is not redundantly described herein.

According to above descriptions, the cascade complementary source follower according to the embodiments of the present disclosure includes a source follower circuit and a feedback circuit. The feedback circuit is configured to clamp a voltage on a MOS transistor that provides an output voltage in the source follower circuit and to change a gate-source voltage of the MOS transistor by adjusting a bias current supplied to the MOS transistor, thereby making an output precisely follow an input.

Based on the above-described embodiments, a controlling circuit is further provided according to an embodiment of the present disclosure. The controlling circuit includes the source follower according to the embodiments described above, where reference can be made to the source follower described above for relevant matters. The source follower can be used as a voltage buffer, a drive capacitor or a resistive load.

The embodiments in this specification are described in a progressive way, each of which emphasizes the differences from others, and reference can be made to each other for the same or similar parts. Since the controlling circuit according to the embodiments corresponds to the source follower according to the embodiments, the description thereof is relatively simple, and for relevant matters references can be made to the description of the source follower.

It is noted that in the present disclosure, relational terms such as "first" and "second" are merely used to distinguish one entity or operation from another entity or operation, but do not indicate or imply an actual relationship or order of these entities or operations. Furthermore, terms of "include", "comprise" or any other variants thereof are intended to be non-exclusive. Therefore, an article or device including multiple elements includes not only the elements but also other elements that are not enumerated, or also include the elements inherent for the article or device. Unless expressively limited otherwise, the statement "comprising (including) one . . . " does not exclude the case that other similar elements may exist in the article or device.

With the description of the embodiments disclosed above, those skilled in the art can implement or use the technical solutions of the present disclosure. Numerous modifications to the embodiments are apparent to those skilled in the art, and the general principles defined herein may be implemented in other embodiments without departing from the spirit or scope of the present disclosure. Therefore, the present disclosure are not limited to the embodiments described herein, but shall comply with the widest scope consistent with the principles and novel features disclosed herein.

The invention claimed is:

1. A cascade complementary source follower, comprising:
    a source follower circuit comprising at least two MOS transistors; and
    a feedback circuit, configured to clamp a voltage on a MOS transistor that provides an output voltage in the source follower circuit and to change a gate-source voltage of the MOS transistor by adjusting a bias current supplied to the MOS transistor,
    wherein the source follower circuit has an input terminal configured to receive an input voltage and an output terminal configured to provide an output voltage; and
    the feedback circuit comprises an operational amplifier and a controlling MOS transistor,
    wherein the operational amplifier has a non-inverting input terminal that is connected to the output terminal of the source follower circuit, an inverting input terminal that is connected to the input terminal of the source follower circuit, and an output terminal that is connected to a gate of the controlling MOS transistor, and the controlling MOS transistor has a drain that is connected to the output terminal of the source follower circuit and a source that is connected to a set potential.

2. The cascade complementary source follower according to claim 1, wherein the controlling MOS transistor is an N-type MOS transistor and the set potential is a grounded zero potential.

3. The cascade complementary source follower according to claim 2, wherein the source follower circuit comprises an N-type source sub-follower and a P-type source sub-follower that are cascaded;
    the N-type source sub-follower comprises an N-type MOS transistor, wherein the N-type MOS transistor has a source functioning as the output terminal of the source follower circuit and grounded through a first current source, and a drain that is connected to a first power supply voltage; and
    the P-type source sub-follower comprises a P-type MOS transistor, wherein the P-type MOS transistor has a gate that functions as the input terminal of the source follower circuit, a source that is connected to a second power supply voltage through a second current source and to a gate of the N-type MOS transistor, and a drain that is grounded.

4. The cascade complementary source follower according to claim 2, wherein the source follower circuit comprises an N-type source sub-follower and a P-type source sub-follower that are cascaded;
    the N-type source sub-follower comprises a first N-type MOS transistor and a second N-type MOS transistor, wherein the first N-type MOS transistor has a source that is connected to the output terminal of the source follower circuit, and a drain that is connected to a first power supply voltage through a first current source and to a gate of the second N-type MOS transistor, and the second N-type MOS transistor has a drain that is connected to the output terminal of the source follower circuit and a source that is grounded; and
    the P-type source sub-follower comprises a first P-type MOS transistor and a second P-type MOS transistor, wherein the first P-type MOS transistor has a gate that functions as the input terminal of the source follower circuit, a drain that is grounded through a second current source, and a source that is connected to a gate of the first N-type MOS transistor, and the second P-type MOS transistor has a gate that is connected to the drain of the first P-type MOS transistor, a source that is connected to a second power supply voltage, and a drain that is connected to the source of the first P-type MOS transistor.

5. The cascade complementary source follower according to claim 1, wherein the controlling MOS transistor is a P-type MOS transistor and the set potential is a second power supply voltage.

6. The cascade complementary source follower according to claim 5, wherein the source follower circuit comprises an N-type source sub-follower and a P-type source sub-follower that are cascaded;
    the N-type source sub-follower comprises an N-type MOS transistor, wherein the N-type MOS transistor has a gate that functions as the input terminal of the source follower circuit, a drain that is connected to a first power supply voltage, and a source that is grounded through a first current source; and
    the P-type source sub-follower comprises a P-type MOS transistor, wherein the P-type MOS transistor has a gate that is connected to the source of the N-type MOS transistor, a source that functions as the output terminal of the source follower circuit and is connected to a second power supply voltage through a second current source, and a drain that is grounded.

7. The cascade complementary source follower according to claim 5, wherein the source follower circuit comprises an N-type source sub-follower and a P-type source sub-follower that are cascaded;
    the N-type sub-source follower comprises a first N-type MOS transistor and a second N-type MOS transistor, wherein the first N-type MOS transistor has a gate that functions as the input terminal of the source follower circuit, a source that is connected to a drain of the second N-type MOS transistor, and a drain that is connected to a first power supply voltage through a first current source, and the second N-type MOS transistor has a gate that is connected to the drain of the first N-type MOS transistor, and a source that is grounded; and the P-type source sub-follower comprises a first P-type MOS transistor and a second P-type MOS transistor, wherein the first P-type MOS transistor has a gate that is connected to the source of the first N-type MOS transistor, a source that is connected to the output terminal of the source follower circuit, and a drain that is grounded through a second current source, and the second P-type MOS transistor has a gate that is connected to the drain of the first P-type MOS transistor, a source that is connected to a second power supply voltage, and a drain that is connected to the source of the first P-type MOS transistor.

8. A controlling circuit, comprising a cascade complementary source follower,
wherein the cascade complementary source follower comprises:
a source follower circuit comprising at least two MOS transistors; and
a feedback circuit, configured to clamp a voltage on a MOS transistor that provides an output voltage in the source follower circuit and to change a gate-source voltage of the MOS transistor by adjusting a bias current supplied to the MOS transistor,
wherein the source follower circuit has an input terminal configured to receive an input voltage and an output terminal configured to provide an output voltage; and
the feedback circuit comprises an operational amplifier and a controlling MOS transistor,
wherein the operational amplifier has a non-inverting input terminal that is connected to the output terminal of the source follower circuit, an inverting input terminal that is connected to the input terminal of the source follower circuit, and an output terminal that is connected to a gate of the controlling MOS transistor, and the controlling MOS transistor has a drain that is connected to the output terminal of the source follower circuit and a source that is connected to a set potential.

9. The controlling circuit according to claim 8, wherein the controlling MOS transistor is an N-type MOS transistor and the set potential is a grounded zero potential.

10. The controlling circuit according to claim 9, wherein the source follower circuit comprises an N-type source sub-follower and a P-type source sub-follower that are cascaded;
the N-type source sub-follower comprises an N-type MOS transistor, wherein the N-type MOS transistor has a source functioning as the output terminal of the source follower circuit and grounded through a first current source, and a drain that is connected to a first power supply voltage; and
the P-type source sub-follower comprises a P-type MOS transistor, wherein the P-type MOS transistor has a gate that functions as the input terminal of the source follower circuit, a source that is connected to a second power supply voltage through a second current source and to a gate of the N-type MOS transistor, and a drain that is grounded.

11. The controlling circuit according to claim 9, wherein the source follower circuit comprises an N-type source sub-follower and a P-type source sub-follower that are cascaded;
the N-type source sub-follower comprises a first N-type MOS transistor and a second N-type MOS transistor, wherein the first N-type MOS transistor has a source that is connected to the output terminal of the source follower circuit, and a drain that is connected to a first power supply voltage through a first current source and to a gate of the second N-type MOS transistor, and the second N-type MOS transistor has a drain that is connected to the output terminal of the source follower circuit and a source that is grounded; and
the P-type source sub-follower comprises a first P-type MOS transistor and a second P-type MOS transistor, wherein the first P-type MOS transistor has a gate that functions as the input terminal of the source follower circuit, a drain that is grounded through a second current source, and a source that is connected to a gate of the first N-type MOS transistor, and the second P-type MOS transistor has a gate that is connected to the drain of the first P-type MOS transistor, a source that is connected to a second power supply voltage, and a drain that is connected to the source of the first P-type MOS transistor.

12. The controlling circuit according to claim 8, wherein the controlling MOS transistor is a P-type MOS transistor and the set potential is a second power supply voltage.

13. The controlling circuit according to claim 12, wherein the source follower circuit comprises an N-type source sub-follower and a P-type source sub-follower that are cascaded;
the N-type source sub-follower comprises an N-type MOS transistor, wherein the N-type MOS transistor has a gate that functions as the input terminal of the source follower circuit, a drain that is connected to a first power supply voltage, and a source that is grounded through a first current source; and
the P-type source sub-follower comprises a P-type MOS transistor, wherein the P-type MOS transistor has a gate that is connected to the source of the N-type MOS transistor, a source that functions as the output terminal of the source follower circuit and is connected to a second power supply voltage through a second current source, and a drain that is grounded.

14. The controlling circuit according to claim 12, wherein the source follower circuit comprises an N-type source sub-follower and a P-type source sub-follower that are cascaded;
the N-type sub-source follower comprises a first N-type MOS transistor and a second N-type MOS transistor, wherein the first N-type MOS transistor has a gate that functions as the input terminal of the source follower circuit, a source that is connected to a drain of the second N-type MOS transistor, and a drain that is connected to a first power supply voltage through a first current source, and the second N-type MOS transistor has a gate that is connected to the drain of the first N-type MOS transistor, and a source that is grounded; and
the P-type source sub-follower comprises a first P-type MOS transistor and a second P-type MOS transistor, wherein the first P-type MOS transistor has a gate that is connected to the source of the first N-type MOS transistor, a source that is connected to the output terminal of the source follower circuit, and a drain that is grounded through a second current source, and the second P-type MOS transistor has a gate that is connected to the drain of the first P-type MOS transistor, a source that is connected to a second power supply voltage, and a drain that is connected to the source of the first P-type MOS transistor.

\* \* \* \* \*